(12) United States Patent
Hayashibara et al.

(10) Patent No.: US 6,833,550 B2
(45) Date of Patent: Dec. 21, 2004

(54) ELECTRON MICROSCOPE

(75) Inventors: Mitsuo Hayashibara, Hitachinaka (JP);
Kishio Hidaka, Hitachiota (JP);
Toshiaki Horiuchi, Hitachi (JP);
Tadashi Fujieda, Mito (JP);
Yoshimichi Numata, Mito (JP);
Shuuichi Suzuki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/643,954

(22) Filed: Aug. 20, 2003

(65) Prior Publication Data

US 2004/0144922 A1 Jul. 29, 2004

(30) Foreign Application Priority Data

Jan. 28, 2003 (JP) ........................................ 2003-018184

(51) Int. Cl.$^7$ ................................................ H01J 37/00
(52) U.S. Cl. .................... 250/441.11; 250/310
(58) Field of Search ............................ 250/441.11, 310

(56) References Cited

U.S. PATENT DOCUMENTS

| | | | |
|---|---|---|---|
| 5,442,183 A | 8/1995 | Matsui et al. | |
| 6,031,235 A | * 2/2000 | Ishida et al. | 250/441.11 |
| 6,320,195 B1 | * 11/2001 | Magome | 250/442.11 |

OTHER PUBLICATIONS

MTV–2 Model Hitachi–Akashi Electron Microscope TV.

* cited by examiner

*Primary Examiner*—Kiet T. Nguyen
(74) *Attorney, Agent, or Firm*—Antonelli, Terry, Stout & Kraus, LLP

(57) ABSTRACT

The disclosure is concerned with an electron microscope comprising a casing for encasing an assembly and a display disposed to the casing. The assembly comprises a vacuum container, a vacuum pump for evacuating the vacuum container, an electron emitter disposed at the upper position of the vacuum vessel, a sample chamber disposed at the lower position of the vacuum container and capable of projecting from the casing and a detector for detecting an electron beam emitted from a sample placed in the sample chamber.

21 Claims, 6 Drawing Sheets

ELECTRON MICROSCOPE

DESCRIPTION OF THE INVENTION

1. Field of the Invention

The present invention relates to an electron microscope.

2. Description of the Prior Art

In the semiconductor industry, electron microscopes have been used for inspection of a large number of wafers, devices. Recently, electron microscopes for inspection in the production of various kinds and small number of devices are desired. In these fields, the use of many small sized electron microscopes for saving spaces that are arranged to distributes their sharing in accordance with purchase orders is more advantageous than the use of a single large scale electron microscope from the view point of the total cost.

Therefore, electron microscopes of space-saving and better portability that can be operated without troublesome preparation for operation have been strongly desired. In the fields of medical treatment and food industry, where needs for electron microscopes are growing, quick inspection and diagnosis by means of electron microscopes are demanded. The ultimate use of the electron microscopes is to carry out the inspection or diagnosis at sites of the industry or medical treatment, etc.

It is expected that needs for downsized electron microscopes will be increased in a custom semiconductor device industry, medical treatment, and a food industry. A downsized electron microscope was put on the market under the trade name of "Micro Television" 1970s. Further, U.S. Pat. No. 5,442,183 discloses an electron microscope whose height between the electron beam gun and the sample holder is only about 200 mm.

However, the weight of the electron microscope of Micro Television including a vacuum container, a vacuum pump, a display, etc was about 84 kg. That is, the above-mentioned electron microscope is too large to bring it to the sites in view of the size and weight. Thus, the inspection and diagnosis at sites was quite difficult as a matter of fact.

Further, a short start-up time is important for the downsized electron microscope. Since a power source is not always available during the transportation of the electron microscope to the sites, shortening of the start-up time from the state of the device in the air opened until the start of the time of inspection or diagnosis is quite important for the practical use.

Although the above-mentioned Micro Television is relatively a small sized electron microscope, the device is not easy for transportation because of its weight and it has a problem of star-up time. Similarly, though the electron microscope disclosed in U.S. Pat. No. '183 is downsized as to the electron emitter, the vacuum container and the sample holder, transportation or portability of the electron microscope is not considered at all. Thus, it may be difficult to use this electron micro scope at sites.

Although electron microscopes have been used in various industries, there are users or operators who feel burdensome if they are not accustomed to the electron microscopes. This may be a factor to hinder the electron microscopes from exploiting the users. Thus, from the view point of exploitation of human resources, an increase in user friendliness for ordinary people or non-skilled persons is expected.

SUMMARY OF THE INVENTION

Figure 1:
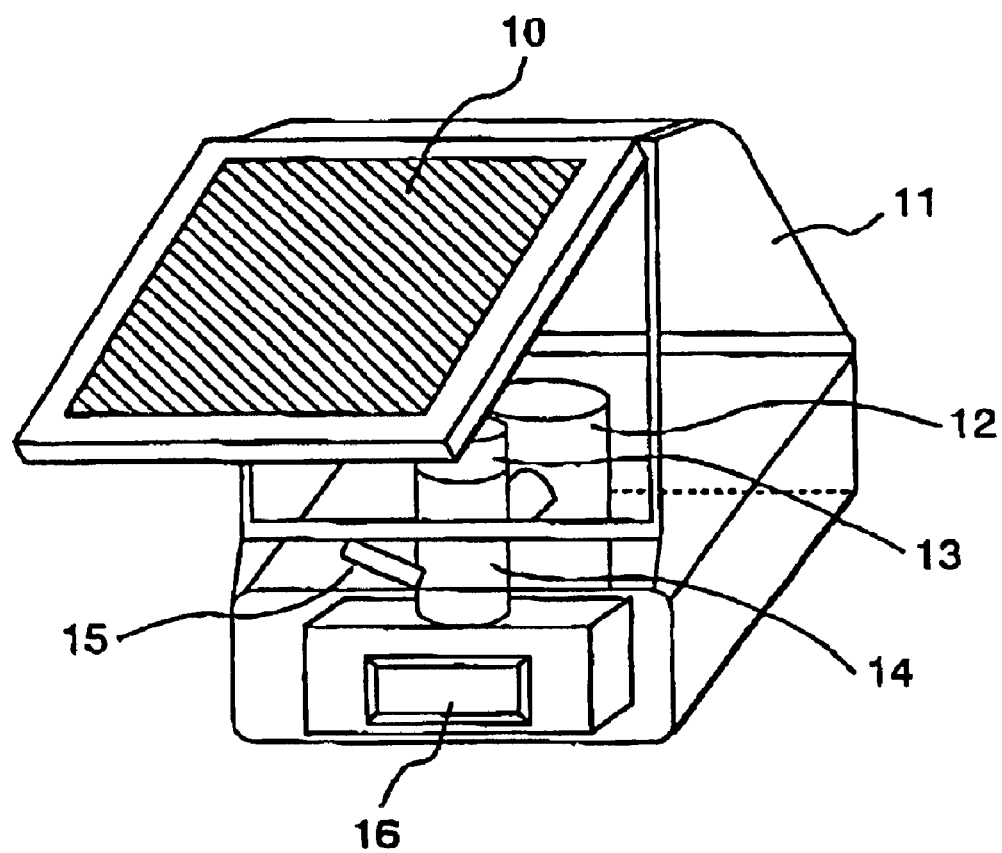
FIG. 1 is a diagrammatic perspective view of the first embodiment of the electron microscope of the present invention.

It is an object of the present invention to provide on electron microscope that is lighter and smaller, and has better portability than the conventional ones.

It is another object of the present invention to provide an electron microscope of which start-up time is shorter than the conventional ones.

It is a further object of the present invention to provide an electron microscope having a better user friendliness than the conventional ones, which leads to relieve the psychological burden on the users.

In order to achieve one or more of the above-mentioned objects, the present invention provides an electron microscope, which comprises: a casing for encasing an assembly and a display disposed to the casing, wherein the assembly comprises a vacuum container, a vacuum pump for evacuating the vacuum container, an electron emitter disposed at the upper position of the vacuum vessel, a sample chamber disposed at the lower position of the vacuum container and capable of projecting from the casing and a detector for detecting an electron beam emitted from a sample placed in the sample chamber. Preferably, the assembly is disposed on the backside of the display.

The electron microscope of the present invention preferably has the components constituting the assembly that are integrally united in the housing. Further, the electron microscope preferably has a turbo molecule pump as the vacuum pump.

The electron microscope of the present invention is preferably equipped with a shock absorber between the vacuum pump and the vacuum chamber. Further, it has the turbo molecule pump as the vacuum pump and a shock absorber disposed between the vacuum pump and the vacuum chamber.

The electron microscope has a plurality of vacuum pumps, the pumps being arranged symmetrically around the vacuum chamber. The electron microscope the electron emitter made of a carbon nanotube or the like. The carbon nanotube can be replaced with nano-metal wires of tungsten, lanthanum boride ($LaB_6$), carbon nano-cone, etc. In the specification, the above-mentioned electrodes or electron emitter is called "nano-electrode". Tip of the nano-electrodes should have a radius of curvature of 100 nm or less, preferably 50 nm or less.

The electron microscope should have the casing that has the total of the longitudinal length, the lateral length and the height of 150 cm or less, and the weight of the microscope is 25 kg or less. This electron microscope is suitable for portable type equipments. The electron microscope should preferably have the power consumption of 1500 W or less.

The electron microscope should preferably have a vacuum pump surrounded by a sonic absorber. The electron microscope has a display where music or image is displayed during vacuum evacuation so that uses can relieve psychological stress during operation.

The electron microscope of the present invention may have a display that displays the degree of vacuum.

The electron microscope should preferably have a part of the outer frame of the united electron microscope that is transparent-colored so that the operator fells easy for operation of evacuation so as to avoid boring.

The electron microscope of the present invention comprises: an assembly comprising a vacuum container, an electron emitter, a vacuum pump, a sample chamber and an electron beam detector; an electron lens for controlling tracks of electron beam; a display for displaying an image based on signals obtained by the detector; and a control power source, wherein the members listed above are all encased in a casing.

The electron microscope should preferably have a plurality of evacuation ports each being different in evacuation capacity, the evacuation port of lower evacuation capacity being disposed at the sample chamber side and the evacuation port of higher evacuation capacity being disposed at the electron emitter side.

At least one of the vacuum pumps is placed on a table that does not touch with the casing, when the electron microscope is placed on the floor or the like. That is, the pump or pumps are floated from the casing in normal operation of the electron microscope.

An application voltage to the electron emitter is 1 kV or lower, so that the structure of the electron microscope is simplified and downsized because various insulators can be small-sized.

DETAILED DESCRIPTION OF THE PREFERRED EMBODIMENTS

The present invention will be explained in detail by reference to the drawings, but it is not intended to limit the scope of the claims of the present invention by these embodiments.

Embodiment 1

FIG. 1 shows a diagrammatical view of the tabletop type electron microscope present invention. The electron microscope comprises an electron microscope casing 11 and a display 10 disposed to the casing 11. The electron microscope of the present invention has an assembly comprising a vacuum container 14, a vacuum pump 12 for evacuating the vacuum container 14, an electron emitter 13 disposed at the upper portion of the vacuum container 14, a sample chamber 16 disposed at the lower portion of the vacuum container 14, the sample chamber 16 being capable of projecting from the casing 11, and a detector 15 for detecting electron beams from a sample placed in the sample chamber. The assembly is installed in the casing and integrally united.

The electron source or electron emitter 13 is preferably a nano-electrode as mentioned before. The electrode 13, the vacuum chamber 14 and the sample chamber 16 are assembled in the casing 11 as shown in FIG. 1. The cylindrical mirror (vacuum chamber) 14 is evacuated from one or more parts by a vacuum pump 12.

An electron lens is formed in the cylindrical mirror 14 for controlling electron beam stream from the electron emitter 13 thereby focusing the beam on the sample placed in the sample chamber 16.

Electrons (secondary electrons or reflection electrons) from the sample are detected by a detector 15, and the signals are processed by a processing circuit installed in the cylindrical mirror to display the result on the display 10. In FIG. 1, the display is in the open state for the purpose of explanation, but a closed type is acceptable, too.

The sample placed in the sample chamber is exchanged with another sample by projecting the sample chamber towards the operator.

The vacuum pump 12 evacuates the vacuum container (cylindrical mirror) 14, the pump being communicated with the vacuum container 14 at one or more points thereof by means of vacuum conduits (not shown).

The electron emitter 13 emits electron beams necessary for measuring the sample. Examples of the electron emitter 13 are tungsten wire having a sharply machined tip, lanthanum hexa-boride (LaB6) wire, a carbon nanotube, etc.

The vacuum container 14 is provided with a magnet (not shown) for constituting an electron lens by which tracks of electron beams are controlled to focus on a sample (not shown) in the sample chamber 16.

The detector 15 detects electron beams (secondary electrons and/or reflective electrons). The display 10 processes signals from the detector 15 with a signal-processing unit disposed in the casing 11 and displays the results. The sample chamber 16 is a room for placing the sample therein, and the exchange of the sample is done by projecting or withdrawing the sample chamber 16 from the casing 14.

In the embodiment shown in FIG. 1, the display 10 is so disposed that it is opened and closed as a part of the casing, but the display 10 may be fixed to the casing, which is not opened and closed (fixed type). In any case, however, the display of liquid crystal type or other flat type displays Should be so installed that a space is formed in the casing 11. the flat panel displays such as liquid crystal displays or organic electroluminescence displays are particularly suitable for energy saving.

In addition to the displays, the power source of the vacuum pump, the control power source for the lens system, the signal processing unit, a control circuit for the total system, etc are all installed in the space behind the display panel 10 in the casing 11. According to this construction, all components for the electron microscope are integrally united without connecting the parts with many wires that have been used in the conventional electron microscope.

In this embodiment, since an air-cooling turbo vacuum pump is employed, a cooling piping is not necessary. As a result, the portability of the electron microscope is excellent. The vacuum pump disposed to the mirror cylinder has a pumping speed (capacity) of about 50 litters per second, which leads to eliminate the cooling piping.

Figure 2:
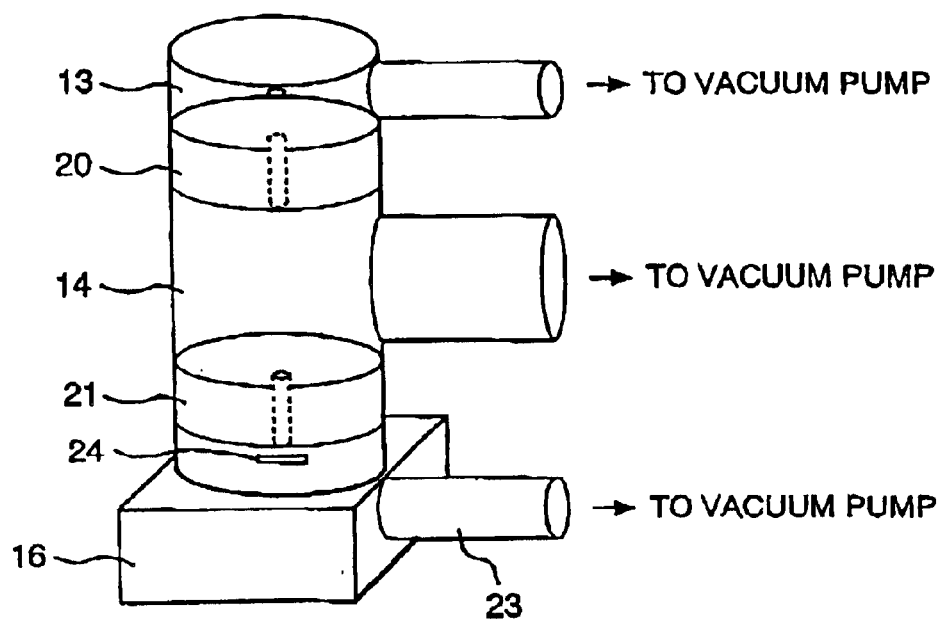
FIG. 2 is a diagrammatic perspective view of a vacuum evacuation system employed in the first embodiment shown in FIG. 1.

FIG. 2 shows a perspective view of a vacuum evacuation system employed in the embodiment shown in FIG. 1. The vacuum evacuation system of FIG. 2 comprises the vacuum container 14, the electron emitter 13 disposed at the upper portion of the vacuum container 14 and the sample chamber 16 disposed at the lower portion of the vacuum container 14. The emitter source 13, mirror cylinder 14 and sample chamber 16 are connected with vacuum pumps with vacuum piping 23.

The electron emitter 13 is made of $LaB_6$, for example, and the vacuum container 14 is made of stainless steel (SUS) having an inner diameter of 80 mm and a length of 160 mm. A condenser lens 20 and an object lens 21 are disposed in the vacuum container 14 at the lower portion of the electron emitter 13. The sample chamber 16 and the electron emitter 13 are communicated with an orifice of 0.5 mm diameter to evacuate them.

There is in the sample chamber 16 a stage for adjusting a sample position to be measured. The stage is capable of moving by ±5 mm in x, y and z directions and its center portion can incline by about 60 degrees.

A power source for the vacuum pump, a power source for controller of the electron lens system, a control circuit for the electron microscope, etc are disposed in the space of the casing 11 and at the back of the display 10. According to the structure, the components in the casing can be united and integrated so as to eliminate or greatly reduce the cables that connect the components. As a result, a downsized electron microscope is realized. When the turbo pump is used, cooling pipings are not necessary to assist the downsizing.

In the electron microscope of this embodiment, vibration by the vacuum pump was investigated to solve the problem due to vibration. This embodiment eliminated a cooling piping. A turbo vacuum pump and a rotary pump or a diaphragm pump was used. Vibration generated by these pumps may give some adverse affect on the measurement to drastically lower resolution. Since the turbo vacuum pump connected to the vacuum container (mirror cylinder) 14 gives directly vibration to the vacuum container, a countermeasure to the vibration is necessary.

Figure 3:
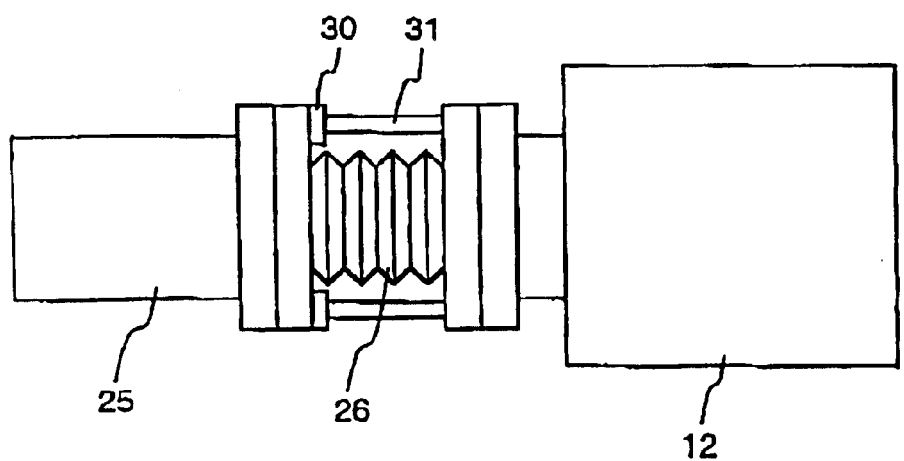
FIG. 3 is a diagrammatic side view of a connection portion between a vacuum piping communicated with the vacuum container and the vacuum pump.

As shown in FIG. 3, a bellows 26 and a shock absorber 30 are disposed between the vacuum pump 12 and the vacuum container (mirror cylinder) 14, thereby to absorb vibration of the vacuum pump 12 with the shock absorber 30. According to this structure, the resolution of several tens nm could be attained. As a result, space saving by unification, portability and performance of the electron microscope of the present invention could be consistent.

The shock absorbers 30 are supported with supporting members 31. The vacuum piping 25 and vacuum pump 12 are connected by means of the vibration eliminating system shown in FIG. 3.

Figure 8:
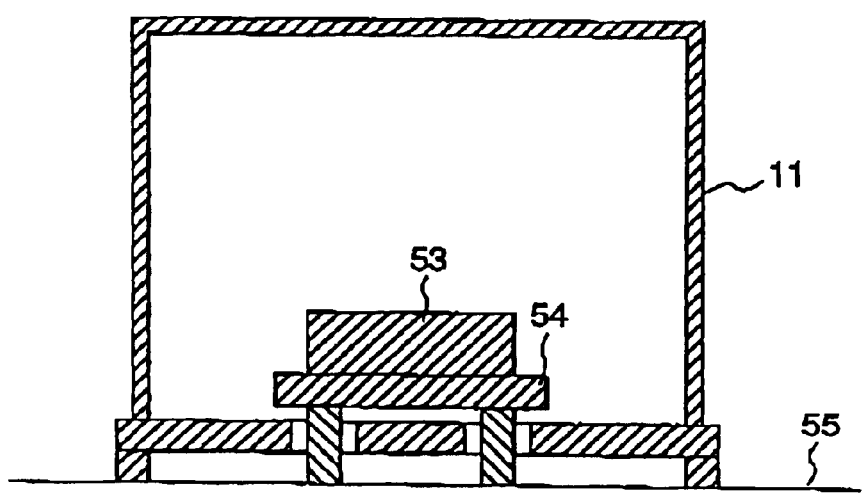
FIG. 8 is a diagrammatic sectional view of another example of the electron microscope of the present invention.

Another countermeasure for preventing vibration is shown in FIG. 8, wherein the vacuum pump 53 is placed on a table 54, which is floated from the casing when the electron microscope is put on the floor 55. This structure is called "island structure". The vibration generated by the pump 53 does not propagate in the casing 11. This structure realizes the portability and improved performance of the electron microscope.

Embodiment 2

Figure 4:
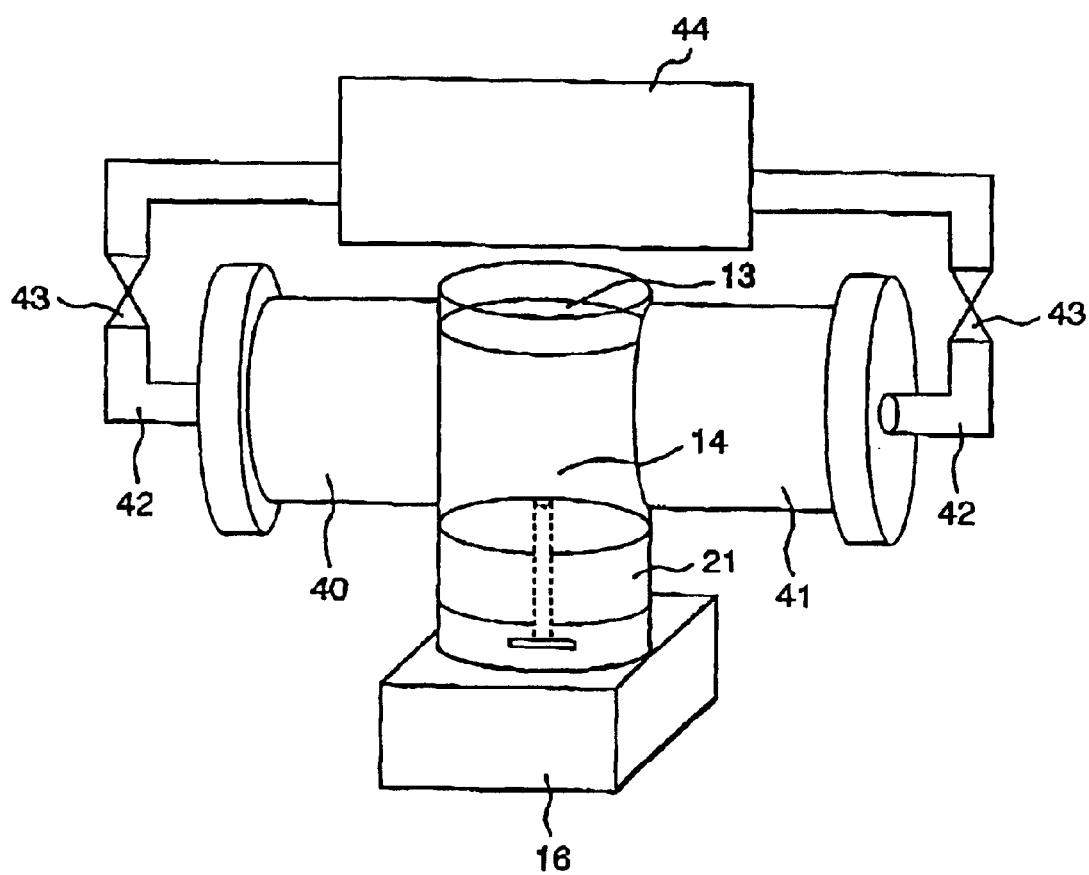
FIG. 4 is a diagrammatic perspective view of a vacuum evacuation system employed in the second embodiment.

FIG. 4 is a diagram of vacuum evacuation system according to this embodiment. Structures other than shown in FIG. 4 are the some as shown in FIG. 1.

The vacuum evacuation system shown in FIG. 4 comprises a vacuum container (mirror cylinder) 14, an electron emitter 13, a sample chamber 16, and vacuum pumps 40, 41. The pumps are symmetrically arranged around the vacuum container 14. The vacuum container is provided with an object lens 21. The vacuum pumps 40, 41 connected with the vacuum container 14 are turbo molecule pumps of evacuation speed of 30 to 40 litters per second.

In the electron microscope of this embodiment, almost identical vacuum pumps 40, 41 are symmetrically arranged around the vacuum container 14 from the viewpoint that the vibration characteristics are rotational vibration that stems from the rotating mechanism. According to this structure, the vibration of each of the pumps could be cancelled. This structure could suppress the vibration, and space saving, portability and performance of the electron microscope could be achieved.

A vacuum pump 44 is connected with the vacuum pump 40 or 41 by means of vacuum piping 42 having a valve 43.

Embodiment 3

The electron microscope of this embodiment employed a carbon nanotube as an electron emitter. Structures other than the above are the same as those described in embodiment 1.

The electron emitter was constituted by connecting the carbon nanotube having a diameter of about 20 nm and a length of 1 $\mu$m with a tungsten wire electrode having the same diameter. The carbon nanotube and the tungsten wire was connected with carbon. Since the carbon nanotube has a very small diameter, a high bright electron beam could be obtained. Therefore, a condenser lens could be omitted, and electron beams could be obtained only by the object lens. In this single stage lens structure, the mirror length was only about 130 mm, thereby to downsize the vacuum container.

Figure 5:
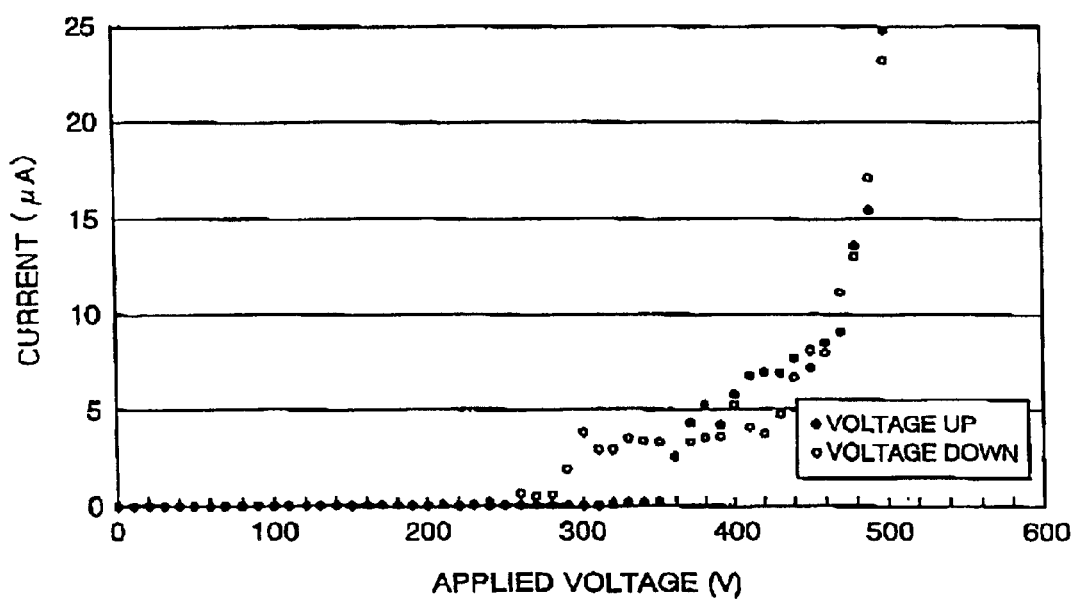
FIG. 5 is a graph showing electron emission characteristics of the electron emitter employed in the third embodiment.

FIG. 5 shows the measurement results of the electron emitter characteristics. The carbon nanotube was formed on a tungsten electrode in the following manner. The tungsten electrode fixed in the cylindrical mirror is placed in a vacuum chamber, where hydrocarbon gas is filled as a carbon source. A carbon nanotube was brought in a contact with the tungsten electrode. The contact portion was irradiated with electron beam to decompose the hydrocarbon and deposit carbon on the contact portion. The carbon nanotube and the tungsten electrode were fixed to each other. When the carbon nanotube having a tip whose radius of curvature is 10 to 20 nm is used, emission of electrons started at a voltage of about 300 V.

Since the embodiment employed the carbon nanotube, it was confirmed that electron emission started at a voltage of around 300 V. In the conventional tungsten electrode, a high voltage of electron emission is several kV was necessary, but in this embodiment, a desired electron beam could be obtained even at a very low voltage. Thus, the electron microscope of this embodiment achieves a low voltage of a power source, which leads to simplification of insulation structure and downsizing of the power source.

The electron microscope of desk top type of this embodiment encased the power source and control system in the electron microscope casing 11 and they are integrally united, and its volume was only 50 cm×50 cm×50 cm (the total length of longitude+latitude+height=150 cm). The weight was only 25 kg or less.

The electron microscope of this embodiment has no complicated wiring outside of the casing 11, and is space saving and is good portability.

In this example, the carbon nanotube was used, but other nano sized electron emitters can be used. For example, nano sized wires made of silver, gold, nickel, etc can be used. The tip of the wires should have a radius of curvature of 10 nm or less, preferably 10 to 50 nm. When these wires are used, electron emission begins at a voltage of 1 kV or lower so that downsizing of the power sources is possible.

Embodiment 4

Figure 6:
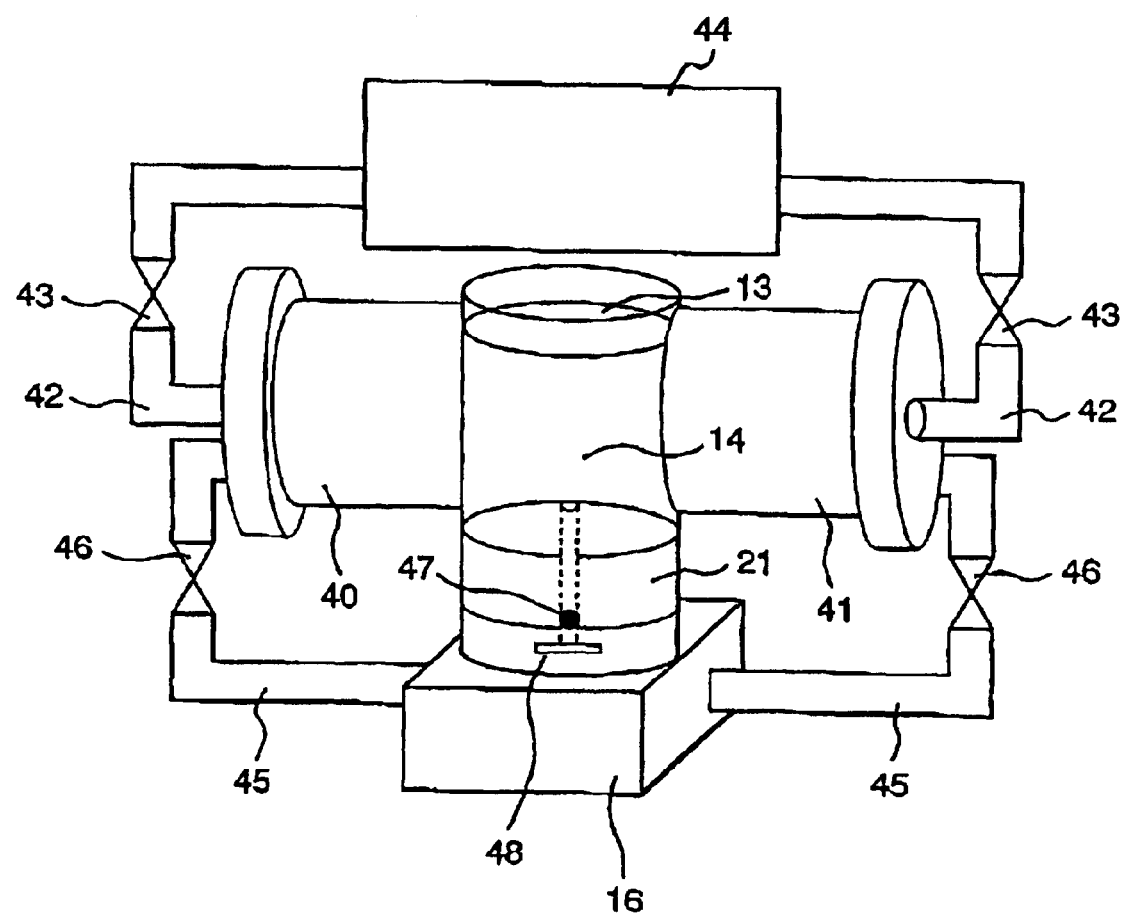
FIG. 6 is a diagrammatic perspective view of the electron microscope of the fourth embodiment of the present invention.

FIG. 6 shows a diagram for explaining in detail a vacuum evacuation system of this embodiment. In this embodiment, vacuum pumps 40, 41 were employed. The vacuum pumps each has 2 ports for evacuation. Structures other than the above-mentioned are the same as those described in embodiment 2.

This embodiment is featured by installing two sets of vacuum pipings 42, 45 having valves 43, 46, one of the pipings connecting the vacuum pump 44 and vacuum pumps 40, 41 and the other connecting the vacuum pumps 40, 41 and the sample chamber 16.

The sample chamber 16 is evacuated through the vacuum piping 45, and the sample chamber 16 and the electron emitter 13 were isolated from each other by means of an orifice 47 and a gate valve 48 to constitute independent vacuum rooms. As a result, the electron emitter is kept at a high vacuum degree. When the gate valve 48 is opened or closed, sample exchange is conducted while keeping the vacuum of the electron emitter 13.

Although a high vacuum degree is needed on the electron emitter side to emit electrons, there is a case where a low vacuum is appropriate on the sample chamber side, depending the measurement conditions of a sample. There is water contained in the sample, for example. According to the system of the independent vacuum sections, better measurement conditions may be provided.

A turbo pump having evacuation ports each having different capacity for evacuation is used, and a lower evacuation port is connected to the sample chamber side, and a higher evacuation port to the electron emitter side.

When the carbon nanotube is used, a sufficient electron emission could be obtained even at a vacuum of $10^{-5}$ Pa. Therefore, when the inner diameter of the vacuum container is 80 mm, and when two turbo vacuum molecule pumps having a capacity of 35 litters per second are installed, the electron microscope can start-up within 10 minutes from the sate of air-open. If only sample exchange is needed (vacuum of the electron microscope is kept), measurement of the sample can be started within 5 minutes.

Further, in case of the carbon nanotube, sufficient amount of electrons can be irradiated onto the sample through a narrow orifice 47.

According to this embodiment, the electron microscope can be started within a short period of time, while the conventional electron microscope needed a long period of time to start-up. Further, there is no problem in exchanging a sample.

Furthermore, in the above-mentioned embodiment, a power source for the vacuum evacuation system is less than several hundreds W, or even 1500 W including lens system and control system. The electron microscope con be operated by an ordinary commercial power source. Therefore, there is no re-wiring for the electron microscope in case of rearrangement of the electron microscope.

Embodiment 5

Users of electron microscopes are expanding into various fields. Thus, electron microscopes that are usable for beginners are strongly desired.

Generally, a sound or image means for transmitting information to an operator is widely used. In case of information transmission at the site of an electron microscope, there is a problem that the vacuum pump, especially a pump at a low vacuum side makes noise, which may hinder the information transmission by sound. The numerals shown in FIG. 7 indicate the same elements as they have the some ones as in FIGS. 4 and 6.

Figure 7:
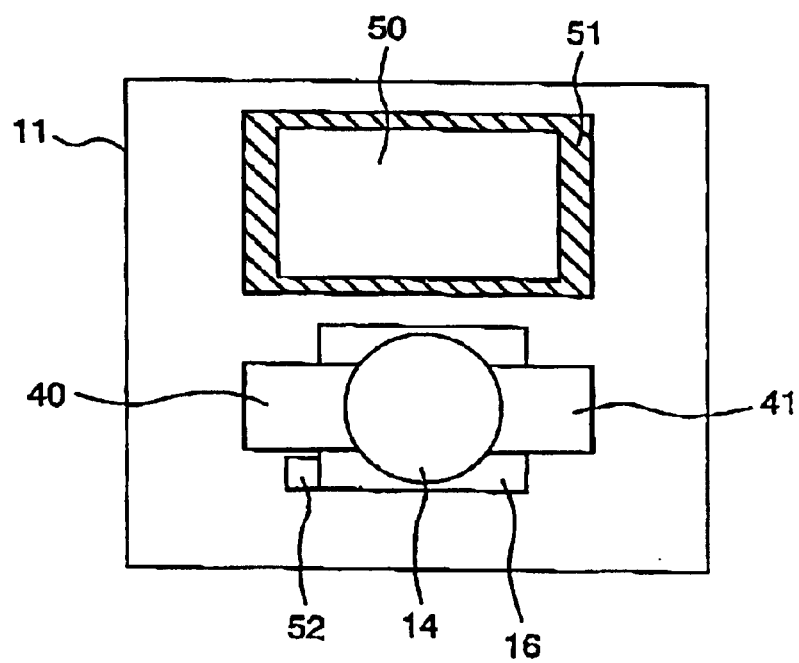
FIG. 7 is a diagrammatic top plane view showing the arrangement of the sound isolating member, the vacuum container (mirror cylinder), the vacuum meter, etc of the fifth embodiment.

In this embodiment, as shown in FIG. 7, the vacuum pump 50 at the lower vacuum side is surrounded by a sound isolation member 51 to eliminate the problem mentioned-above.

In general, since evacuation time differs, based on the air-open time or a kind of sample, users especially non-skilled users tend to feel the evacuating time longer than as it is, and sometimes they feel fears. As a result, they cannot get rid of the state that they always need help of advisers. In order to increase efficiency of a job per person, an electron microscope that has a function to relieve the psychological burden is desired.

The electron microscope of this embodiment was provided with a function to relieve the users' psychological burden by displaying the degree of evacuation that is measured with a vacuum meter 53.

The control unit of the microscope was also provided with a function to output music or to display images, based on the information of the vacuum meter 53 so that the users' psychological burden was relieved. Since the microscope of this embodiment employed a colored transparent portion as a part of the electron microscope casing, the microscope could eliminate the feeling of the conventional microscope that has an image like a black box, and could become a system having user friendliness.

The electron microscope of the present invention has advantages that it is a space saving and lighter system than the conventional ones. It has also better portability than the conventional microscopes. Further, the microscope of the present invention has shorter start-up time than the conventional ones. The microscope of the present invention has much more user friendliness than the conventional ones.

What is claimed is:

1. An electron microscope, which comprises: a casing for encasing an assembly and a display disposed to the casing, wherein the assembly comprises a vacuum container, a vacuum pump for evacuating the vacuum container, an electron emitter disposed in the vacuum container, a sample chamber disposed in the vacuum container, and a detector for detecting an electron beam emitted from a sample placed in the sample chamber.

2. The electron microscope as defined in claim 1, wherein the assembly being capable of projecting from the casing.

3. The electron microscope as defined in claim 1, wherein components constituting the assembly are integrally united in the casing.

4. The electron microscope as defined in claim 1, wherein the vacuum pump is a turbo molecule pump.

5. The electron microscope as defined in claim 1, wherein a shock absorber is disposed between the vacuum pump and the vacuum container.

6. The electron microscope as defined in claim 1, wherein the vacuum pump is a turbo molecule pump and a shock absorber is disposed between the vacuum pump and the vacuum container.

7. The electron microscope as defined in claim 1, wherein there are a plurality of vacuum pumps, the pumps being arranged symmetrically around the vacuum container.

8. The electron microscope as defined in claim 1, wherein the electron emitter is a nano sized wire that has a tip of a radius of curvature of 100 nm or less.

9. The electron microscope as defined in claim 1, wherein the electron emitter is a carbon nanotube.

10. The electron microscope as defined in claim 1, wherein the casing has the total of the longitudinal length, the lateral length and the height of 150 mm or less, and the weight of the microscope is 25 kg or less.

11. The electron microscope as defined in claim 1, wherein the power consumption is 1500 W or less.

12. The electron microscope as defined in claim 1, wherein the vacuum pump is surrounded by a sonic absorber.

13. The electron microscope as defined in claim 1, wherein music player or image display is done during vacuum evacuation.

14. The electron microscope as defined in claim 1, wherein a part of an outer frame of components constituting the assembly which are integrally united in the casing is transparent-colored.

15. An electron microscope, which comprises:

- an assembly comprising a vacuum container, an electron emitter, a vacuum pump, a sample chamber and an electron beam detector;
- an electron lens for controlling tracks of an electron beam;
- a display for displaying an image based on signals obtained by the detector; and
- a control power source, wherein at least members of the assembly are all encased in a casing.

16. The electron microscope as defined in claim 15, wherein the vacuum pump is a turbo molecule pump, and a shock absorber is disposed between the vacuum pump and the vacuum container.

17. The electron microscope as defined in claim 15, wherein there is a plurality of vacuum pumps, which are symmetrically disposed around the vacuum container.

18. The electron microscope as defined in claim 15, wherein the electron emitter has a carbon nanotube.

19. The electron microscope as defined in claim 15, wherein the vacuum pump is a turbo vacuum pump having a plurality of evacuation ports each being different in evacuation capacity, the evacuation port of lower evacuation capacity being disposed at the sample chamber side and the evacuation port of higher evacuation capacity being disposed at the electron emitter side.

20. The electron microscope as defined in claim 15, wherein a part of the casing is a transparent-colored.

21. The electron microscope as defined in claim 15, wherein the electron lens and the display are encased in the casing.

* * * * *